(12) United States Patent
Chen et al.

(10) Patent No.: US 7,999,189 B2
(45) Date of Patent: Aug. 16, 2011

(54) CIRCUIT BOARD STRUCTURE AND METHOD FOR FABRICATING THE SAME

(75) Inventors: Chin-Te Chen, Taichung Hsien (TW); Ke-Chuan Yang, Taichung Hsien (TW); Hung-Ming Chang, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 418 days.

(21) Appl. No.: 12/218,891

(22) Filed: Jul. 18, 2008

(65) Prior Publication Data
US 2009/0020323 A1  Jan. 22, 2009

(30) Foreign Application Priority Data
Jul. 20, 2007  (TW) ................................ 96126506 A

(51) Int. Cl.
    *H05K 1/09*  (2006.01)
(52) U.S. Cl. ........................................ 174/257; 361/760
(58) Field of Classification Search .................. 174/257; 361/760; 257/700, 779, 780, 773; 29/832, 29/840, 740, 846
See application file for complete search history.

(56) References Cited

U.S. PATENT DOCUMENTS

| | | |
|---|---|---|
| 5,706,178 A | 1/1998 | Barrow |
| 6,396,707 B1 | 5/2002 | Huang et al. |
| 6,543,128 B2 * | 4/2003 | Huang et al. ............ 29/841 |
| 6,559,540 B2 * | 5/2003 | Kawashima ............ 257/737 |
| 6,884,652 B2 * | 4/2005 | Huang et al. ............ 438/106 |
| 7,145,225 B2 * | 12/2006 | Lee ............ 257/686 |
| 7,227,263 B2 * | 6/2007 | Yamaguchi ............ 257/738 |
| 7,816,187 B2 * | 10/2010 | Huang et al. ............ 438/124 |

* cited by examiner

*Primary Examiner* — Yuriy Semenenko
(74) *Attorney, Agent, or Firm* — Peter F. Corless; Steven M. Jensen; Edwards Angell Palmer & Dodge LLP

(57) ABSTRACT

A circuit board structure and a method for fabricating the same are disclosed, including providing a core board having conductive traces and solder pads respectively formed thereon, wherein width of the solder pads corresponds to that of the conductive traces, and pitch between adjacent solder pads is made wide enough to allow multiple conductive traces to pass through; forming on the core board an insulating layer with openings for exposing the solder pads therefrom; forming on the insulating layer a plurality of extending pads electrically connected to the solder pads respectively, wherein the projection area of the extending pads is larger than that of the corresponding solder pads and covers conductive traces adjacent to the corresponding solder pads. Thus, more conductive traces are allowed to pass between adjacent solder pads and meanwhile, the extending pads provide an effective solder ball wetting area for achieving good solder joints and sufficient height after collapse.

16 Claims, 6 Drawing Sheets

CIRCUIT BOARD STRUCTURE AND METHOD FOR FABRICATING THE SAME

BACKGROUND OF THE INVENTION

1. Field of the Invention

The present invention generally relates to a circuit board structure and a method for fabricating the same, and more specifically, to a fine-pitch circuit board structure and a method for fabricating the same.

2. Description of Related Art

A conventional substrate structure is illustrated in FIGS. 1A and 1B, which are cross-sectional views of a substrate taken from different directions. Solder pads 11 of the conventional substrate for electrically connecting an electronic element are generally SMD (solder mask defined) solder pads, that is, exposed size of the solder pads 11 depends on size of the openings defined by the solder mask layer 12, such that when solder balls are wetted to the solder pads 11, height of the solder balls after collapse can be controlled by the solder mask layer 12. The solder mask layer 12 is adapted to protect conductive traces 13 of the substrate from being damaged by external forces or contaminated by pollutants, and further prevent the conductive traces 13 from getting in contact with the solder balls disposed on the solder pads 11 which may cause short circuit.

However, actual size of the solder pads 11 must be larger than that of the openings of the solder mask layer 12, that is, area of the substrate actually occupied by the solder pads 11 is larger than area of the solder pads 11 exposed from the openings of the solder mask layer 12, and width of the solder pads 11 is apparently larger than width of the conductive traces 13. As a result, the number of the conductive traces 13 that are allowed to pass between the solder pads 11 is quite limited, thus making it difficult to meet a desired design requirement.

For example, conventional SMD solder pads have a size of 800 μm, size of the solder pads exposed from the openings of the solder mask layer is 600 μm, and pitch x between adjacent solder pads is 1270 μm, width of conductive traces is about 100 μm, it can be seen that the SMD structure would only allow a pair of conductive traces to pass through, pitch between adjacent conductive traces is about 90 μm. Obviously, the number of conductive traces that are allowed to pass between the conventional SMD solder pads is quite limited.

In the case a conductive trace 13 cannot pass between the solder pads 11 in a same plane, a build-up technique is applied to form a dielectric layer 15 such that the conductive trace 13 can be connected to another layer of the substrate through a conductive blind via 14 formed in the dielectric layer 15 so as to form a solder pad 11, which however adversely increases the number of the substrate layer and thus increases the fabrication cost and complicates the fabrication process.

In an attempt to solve the problem described above, as depicted in FIG. 2, U.S. Pat. No. 5,706,178 discloses an oval-shaped solder pad structure 21 to increase the routing area between adjacent solder pads 11 and further allow more conductive traces 23 to pass through. Moreover, U.S. Pat. Nos. 6,396,707 and 6,543,128 disclose an elongate-shaped solder pad structure 31, wherein an opening 220 is formed in a solder mask layer 22 to expose partial area of the solder pad 31 as well as two sides of the solder pad 31, such that more conductive traces are allowed to pass between the solder pads through variation in the shape of the solder pads.

For instance, if the short-axle width of the oval-shaped solder pad 21 is 600 μm and width of the elongate-shaped solder pad 31 is smaller than 600 μm, the opening 220 adapted to expose the solder pad from the solder mask layer is 600 μm, the pitch between the centers of two adjacent solder pads is 1270 μm, and width of the conductive traces 23 is about 100 μm, then about four conductive traces can pass through the pitch of about 54 μm between two adjacent solder pads. Although more conductive can pass between adjacent solder pads through variation in shape of solder pads, the available routing area between adjacent solder pads are still constrained by pitch between the openings of the solder mask layer, that is, the number of the conductive traces that can pass between adjacent solder pads depends on and is limited by pitch between the openings. Consequently, this approach still fails to provide effective routing area between adjacent solder pads so as to allow more conductive traces to pass through.

Moreover, if width of the elongate-shaped solder pads or size of the openings of the solder mask layer are too small, wetting area of solder balls may become insufficient, thereby adversely affecting strength of solder joints and height after collapse of solder balls.

As such, it is highly beneficial and desirable to come up with a new approach that can effectively increase the number of conductive traces passing through pitch between solder pads while being able to eliminate drawback of insufficient solder ball wetting area caused by too narrow width of solder pads and adversely affecting strength of solder joints and height after collapse of solder balls.

SUMMARY OF THE INVENTION

In view of the disadvantages of the prior art mentioned above, it is an objective of the present invention to provide a circuit board structure and method for fabricating the same that allows more conductive traces to pass between adjacent solder pads without being constrained by pitch between openings exposing the solder pads.

It is another objective of the present invention to provide a circuit board structure and a method for fabricating the same, which eliminates the need to alter the wetting area and shape of solder pads.

It is a further objective of the present invention to provide a circuit board structure and a method for fabricating the same, which provides a sufficient wetting area and sufficient height after collapse of solder balls.

To achieve the aforementioned and other objectives, the present invention provides a method for fabricating a circuit board structure, comprising the steps of: providing a core board having a plurality of solder pads and conductive traces formed thereon, wherein width of the solder pads corresponds to that of the conductive traces, and pitch between two adjacent solder pads is made wide enough to allow multiple conductive traces to pass through; forming an insulating layer on the core board for covering the conductive traces, the insulating layer having a plurality of openings for exposing the solder pads therefrom; forming on the insulating layer a plurality of extending pads electrically connected to the solder pads respectively, wherein the projection area of the extending pads is larger than that of the corresponding solder pads and covers the conductive traces adjacent to the corresponding solder pads.

In order to increase adhesion force of the extending pads with the insulating layer, a solder mask layer can further be formed on the insulating layer, and a plurality of openings is formed in the solder mask layer to expose the extending pads such that solder balls can be disposed on the extending pads.

The method of manufacturing the extending pads comprises the steps of: forming a conductive layer on the insulating layer and the solder pads exposed from the insulating layer; forming a resist layer on the conductive layer, a plurality of openings being formed in the resist layer corresponding in position to the solder pads; forming in the resist layer a plurality of extending pads electrically connected to the solder pads respectively, wherein the projection area of the extending pads is larger than that of the corresponding solder pads and covers the conductive traces adjacent to the corresponding solder pads; and removing the resist layer and the conductive layer covered by the resist layer.

In another preferred embodiment, the method of manufacturing the extending solder pads comprises the steps of: forming conductive bumps in the openings of the insulating layer, top edges of the conductive bumps being flush with surface of the insulating layer; forming a conductive layer on the insulating layer and the conductive bumps; forming a resist layer on the conductive layer, the resist layer having a plurality of openings formed corresponding in position to the conductive bumps; forming in the openings of the resist layer a plurality of extending pads electrically connected to the conductive bumps in the openings of the resist layer respectively, wherein the projection area of the extending pad is larger than that of the corresponding solder pads and covers the conductive traces adjacent to the corresponding solder pads; and removing the resist layer and the conductive layer covered by the resist layer.

The present invention further provides a circuit board structure, which comprises: a core board; a plurality of conductive traces formed on the core board; a plurality of solder pads formed on the core board, wherein width of the solder pads corresponds to that of the conductive traces, and pitch between two adjacent solder pads is made wide enough to allow multiple conductive traces to pass through; an insulating layer formed on the core board for covering the conductive traces, the insulating layer having a plurality of openings for exposing the solder pads therefrom; a plurality of extending pads formed on the insulating layer and electrically connected to the solder pads respectively, wherein the projection area of the extending pads is larger than that of the corresponding solder pads and covers the conductive traces adjacent to the corresponding solder pads.

In summary, the circuit board structure and method for fabricating the same according to the present invention is characterized by: providing a core board having a plurality of conductive traces and solder pads formed thereon, wherein width of the solder pads corresponds to that of the conductive traces to increase pitch between two adjacent solder pads to allow more conductive traces to pass through than in the prior art; forming a plurality of extending pads on the insulating layer and electrically connected to the solder pads, wherein the projection area of the extending pads is relatively larger than that of the corresponding solder pads and covering the conductive traces adjacent to the corresponding solder pads, thereby providing a sufficient wetting area for solder balls so as to obtain good solder joints and sufficient height after collapse of solder balls without the need to alter the wetting area and shape of solder balls.

BRIEF DESCRIPTION OF DRAWINGS

The present invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by persons skilled in the art after reading the disclosure of this specification. The present invention can also be performed or applied by other different embodiments. The details of the specification may be on the basis of different points and applications, and numerous modifications and variations can be devised without departing from the spirit of the present invention.

First Embodiment

Please refer to FIGS. 3A through 3H, which illustrate a first embodiment of a circuit board structure and a method for fabricating the same in accordance with the present invention.

Figure 1A:
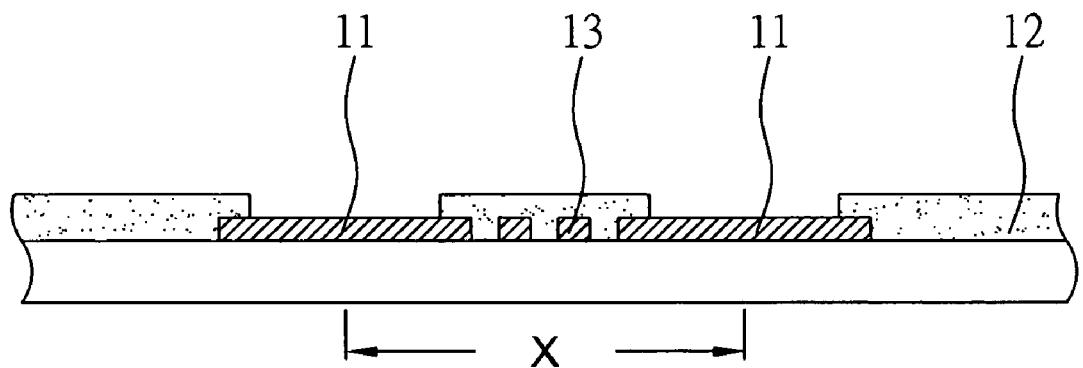
FIGS. 1A and 1B (PRIOR ART) are cross-sectional views of a conventional substrate taken from different directions.
Figure 1B:
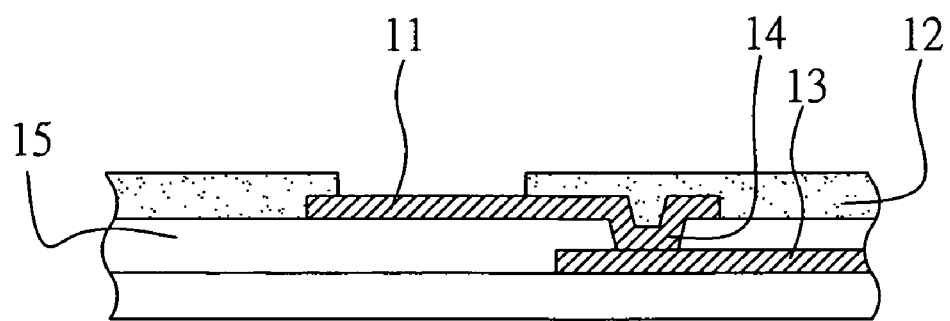
Figure 2:
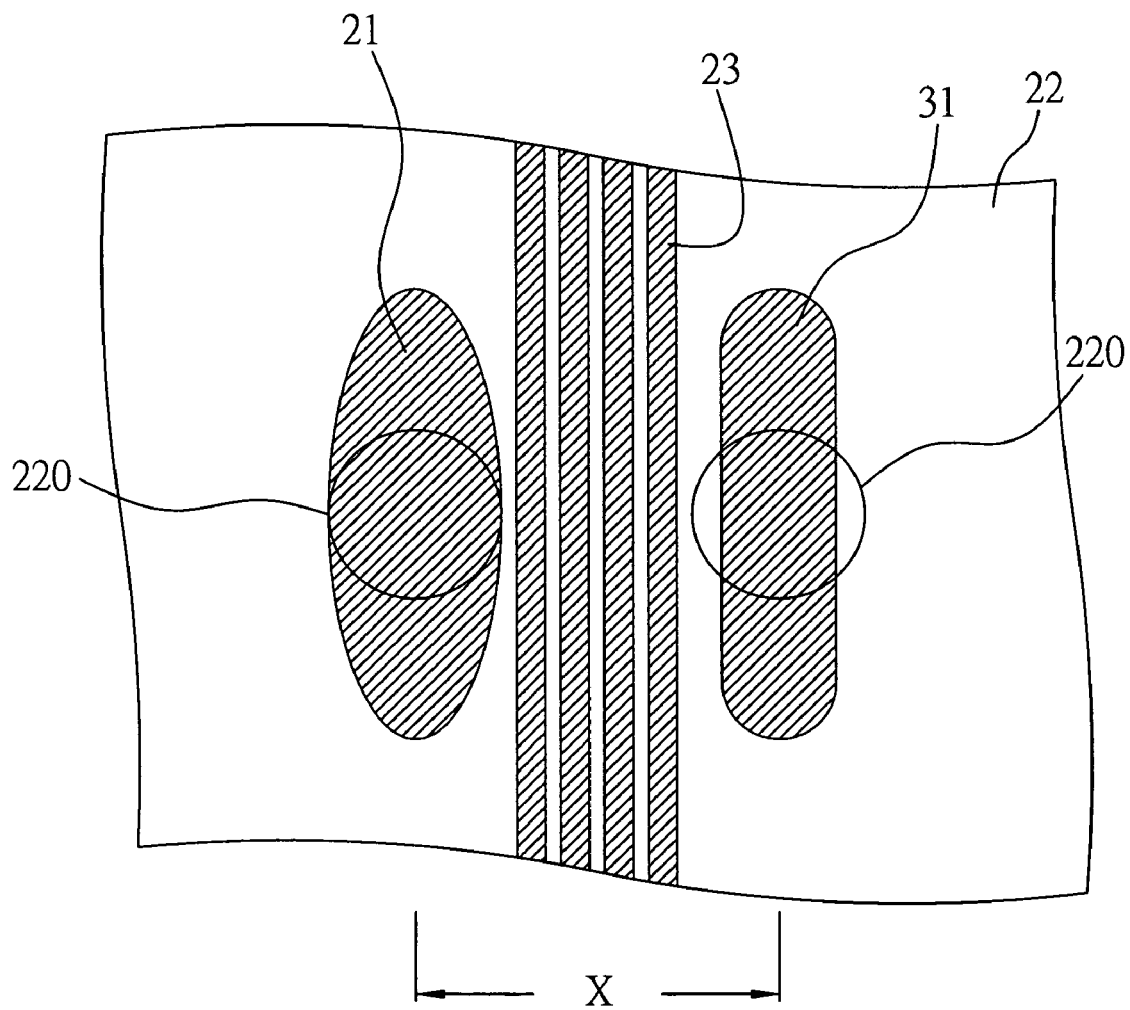
FIG. 2 (PRIOR ART) is a view showing an oval-shaped solder pad disclosed by U.S. Pat. No. 5,706,178, and an elongate-shaped solder pad disclosed by U.S. Pat. Nos. 6,396,707 and 6,543,128 respectively.
Figure 3A:
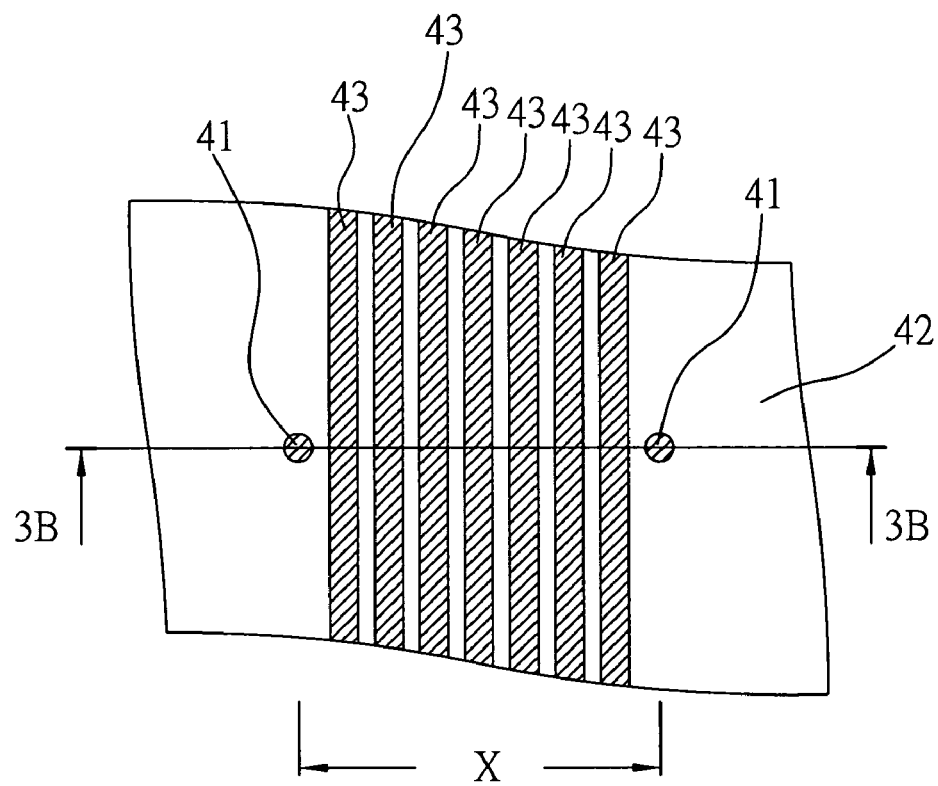
FIGS. 3A through 3H are views showing a first embodiment of a circuit board structure and a method for fabricating the same in accordance with the present invention.
Figure 3B:
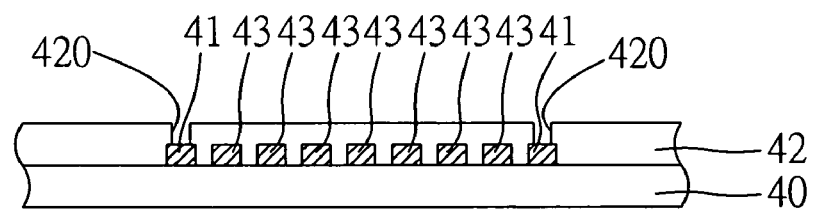

As shown in FIGS. 3A and 3B, wherein FIG. 3B is a cross-sectional view of FIG. 3A, a core board 40 having a plurality of conductive traces 43 and solder pads 41 is provided, wherein width of the solder pads 41 corresponds to that of the conductive traces 43, which can be smaller, equal to or slightly larger than the width of the conductive traces 43. For example, the width of the solder pads 41 can be between 50-100 μm. Pitch between two adjacent solder pads 41 is made wide enough to allow multiple conductive traces 43 to pass through. An insulating layer 42 is formed on the core board 40 for covering the conductive traces 43, and the insulating layer 42 has a plurality of openings 420 for exposing the solder pads 41 therefrom, wherein size of the openings 420 is 10 to 20 μm smaller than that of the solder pads 41. The insulating layer 42 can be such as a solder mask layer.

In the present embodiment, width of the solder pads 41 is equal to that of the conductive traces 43, which is 100 μm. The pitch x between centers of two adjacent solder pads 41 is 1270 μm, which thus allows about seven conductive traces 43 to pass through, wherein pitch between two adjacent conductive traces is about 58.75 μm. Thus, the number of conductive traces allowed to pass between adjacent solder pads is four times the number of conductive traces allowed to pass between conventional round shaped solder pads, and twice the number of conductive traces allowed to pass between conventional oval-shaped or elongate-shaped solder pads.

Figure 3C:
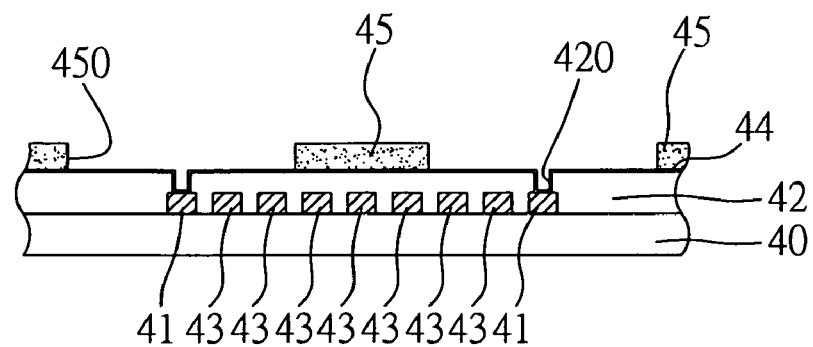

As illustrated in FIG. 3C, a conductive layer 44 such as thin copper is formed on the insulating layer 42 and the solder pads 41 exposed from the insulating layer 42 by means of sputtering or electroless plating, and a resist layer 45 is further formed on the conductive layer 44, the resist layer 45 being formed with openings 450 therein corresponding in position to the solder pads 41, wherein the openings 450 are larger than the corresponding solder pads 41 in size and extend above the conductive traces 43 adjacent to the corresponding solder pads 41.

Figure 3D:
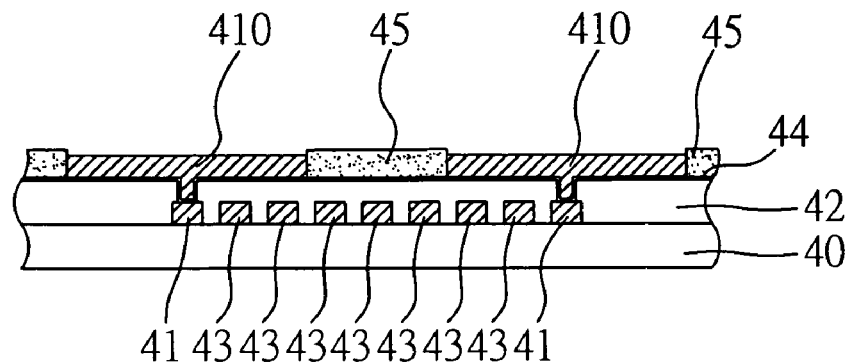

As shown in FIG. 3D, an electroplating process is performed for forming a plurality of extending pads 410 electrically connected to the solder pads 41 in the openings 450 of the resist layer 45 respectively. The extending pads 410 are made of such as Cu, or Cu/Ni/Au.

The area of the extending pads 410 is the final solder area for solder balls, which provides sufficient wetting area for solder balls and sufficient height after collapse of solder balls. The projection area of the extending pads 410 is larger than that of the corresponding solder pads 41 and covers the conductive traces 43 adjacent to the corresponding solder pads 41.

Figure 3E:
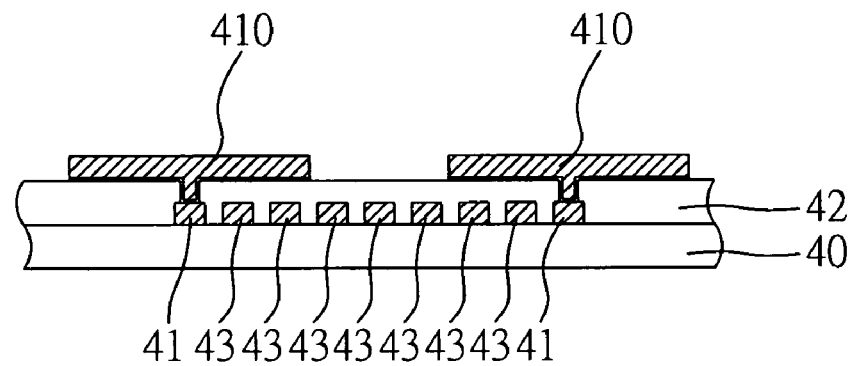
Figure 3F:
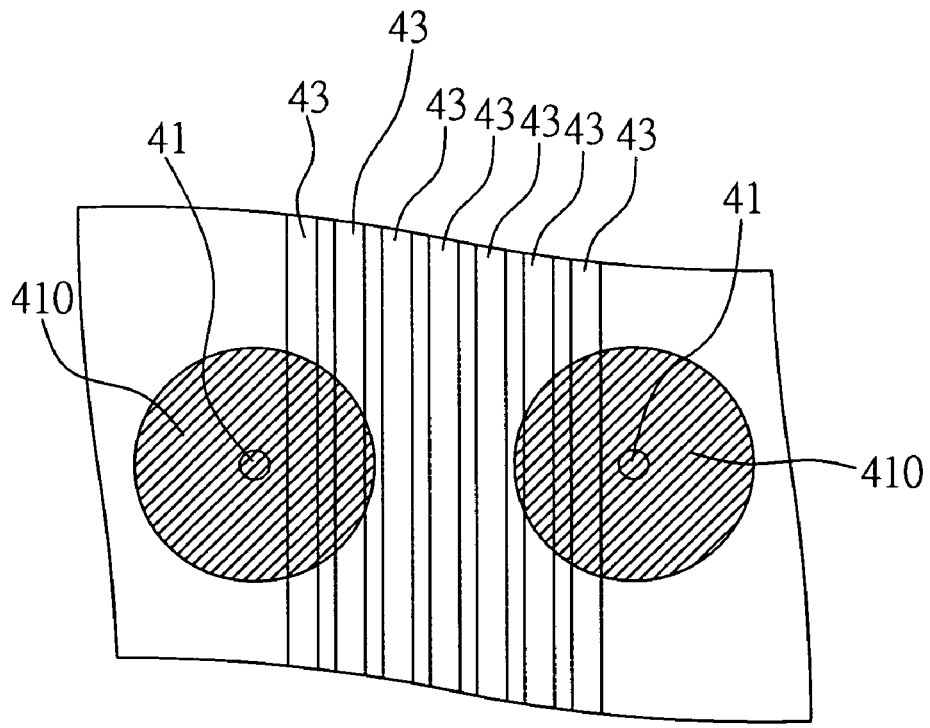
Figure 3G:
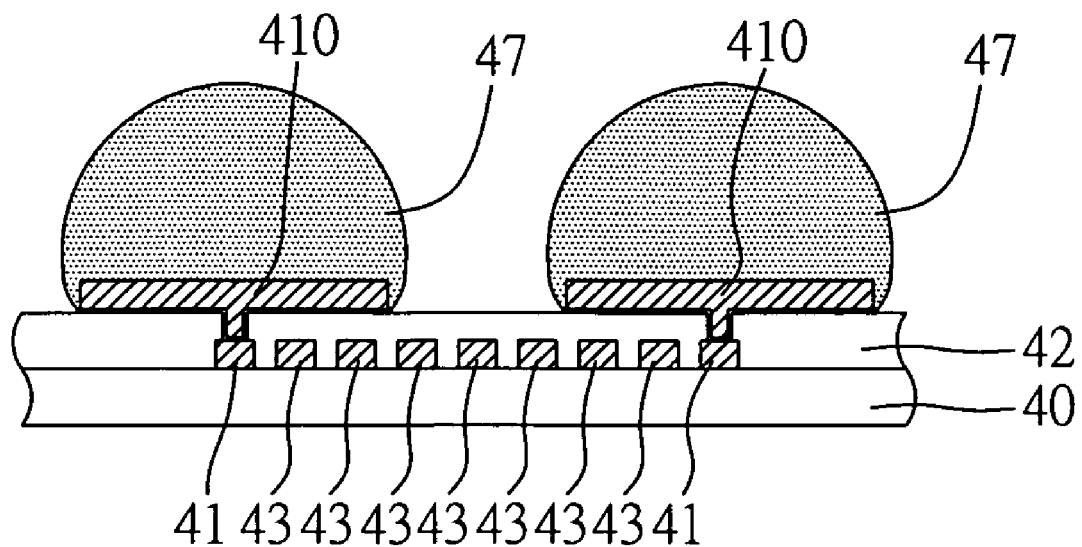

Please refer to FIGS. 3E and 3F in which FIG. 3F is a top view of FIG. 3E, both the resist layer 45 and the conductive layer 44 covered by the resist layer 45 are removed. Thus, a circuit board structure according to the present invention is obtained and solder balls 47 can further be disposed on the extending pads 410, as depicted in FIG. 3G.

Through the fabrication method described above, the present invention further discloses a circuit board structure, comprising: a core board 40; a plurality of conductive traces 43 formed on the core board 40; a plurality of solder pads 41 formed on the core board 40, wherein width of the solder pads 41 corresponds to that of the conductive traces 43, and pitch between two adjacent solder pads 41 is made wide enough to allows multiple conductive traces 43 to pass through; an insulating layer 42 formed on the core board 40 for covering the conductive traces 43, the insulating layer having a plurality of openings for exposing the solder pads 41; a plurality of extending pads 410 formed on the insulating layer 42 and electrically connected to the solder pads 41 respectively, wherein the projection area of the extending pads 410 is larger than that of the corresponding solder pads 41 and covers the conductive traces 43 adjacent to the corresponding solder pads 41. Further, solder balls 47 are disposed on the extending pads 410.

Figure 3H:
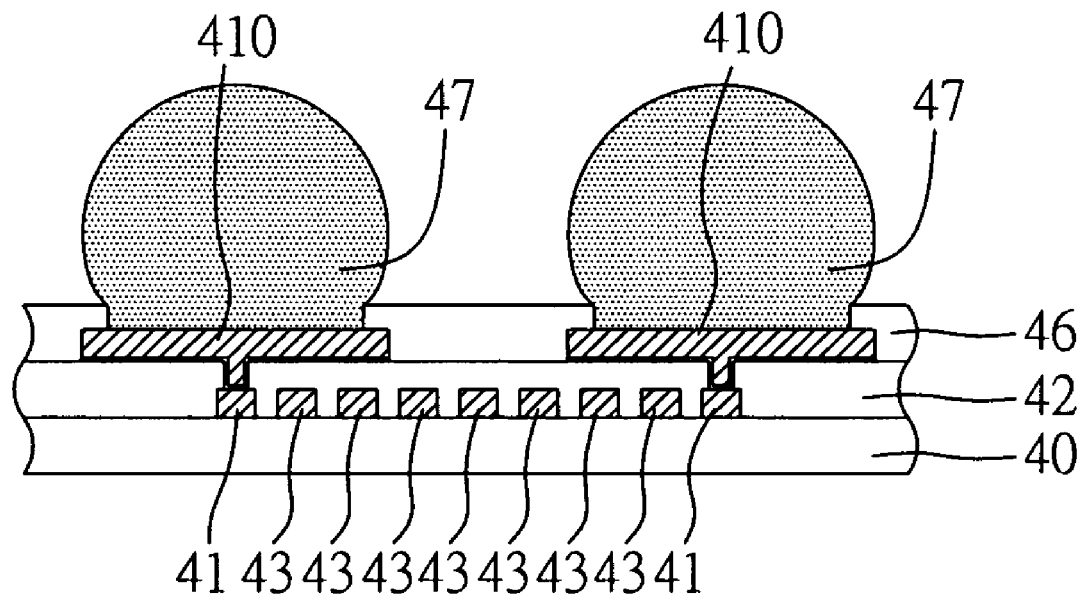

Referring to FIG. 3H, to increase adhesion force between the extending pads 410 and the insulating layer 42, a solder mask layer 46 is further formed on the insulating layer 42, the solder mask layer 46 being formed with a plurality of openings for exposing the extending pads 410 so as to allow the solder balls 47 to be formed on the exposed extending pads 410.

Accordingly, the present invention is characterized by: providing a core board having a plurality of conductive traces and solder pads formed thereon, wherein width of the solder pads corresponds to that of the conductive traces so as to increase the pitch between two adjacent solder pads for allowing more conductive traces to pass through than in the prior art; forming an insulating layer on the core board, the insulating layer having a plurality of openings for exposing the solder pads; and forming on the insulating layer a plurality of extending pads electrically connected to the solder pads respectively, the projection area of the extending pads being larger than that of the corresponding solder pads and covering conductive traces adjacent to the corresponding solder pads.

Further, a solder mask layer is formed on the insulating layer to increase adhesion force of the extending pads with the insulating layer. The solder mask layer has a plurality of openings for exposing the extending pads so as to allow solder balls to be disposed thereon. The provision of the solder pads having a relatively smaller width (for example, corresponding to the width of the conductive traces) allows multiple conductive traces to pass between adjacent solder pads, and further the extending pads with a projection area larger than the corresponding solder pads and even covering the conductive traces adjacent to the corresponding solder pads can provide sufficient solder ball wetting area for obtaining good solder joints and sufficient height after collapse of solder balls.

Second Embodiment

Please refer to FIGS. 4A through 4D, which illustrate a second embodiment of a circuit board structure and a method for fabricating the same in accordance with the present invention.

Figure 4A:
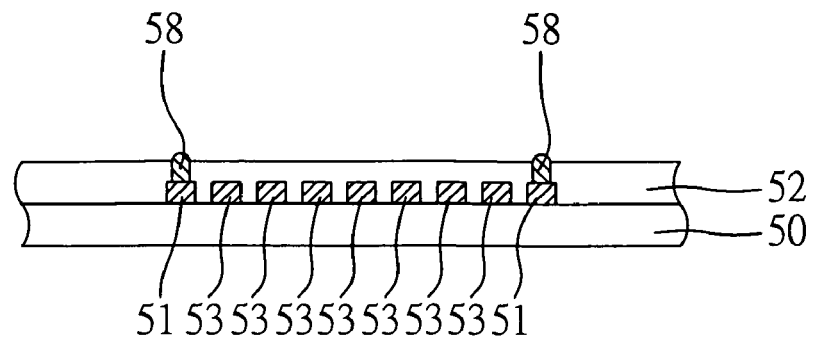
FIGS. 4A through 4D are views showing a second embodiment of a circuit board structure and a method for fabricating the same in accordance with the present invention.

As shown in FIG. 4A, a core board 50 having a plurality of conductive traces 53 and solder pads 51 formed thereon is provided, wherein width of the solder pads 51 corresponds to that of the conductive traces 53, and pitch between two adjacent solder pads 51 is made wide enough to allow multiple conductive traces 53 to pass through. An insulating layer 52 is formed on the core board 50 for covering the conductive traces 53, wherein the insulating layer 52 has a plurality of openings formed for exposing the solder pads 51, and conductive bumps 58 are formed in the insulating layer 52 and electrically connected to the solder pads 51. The conductive bumps 58 can be such as copper bumps.

Figure 4B:
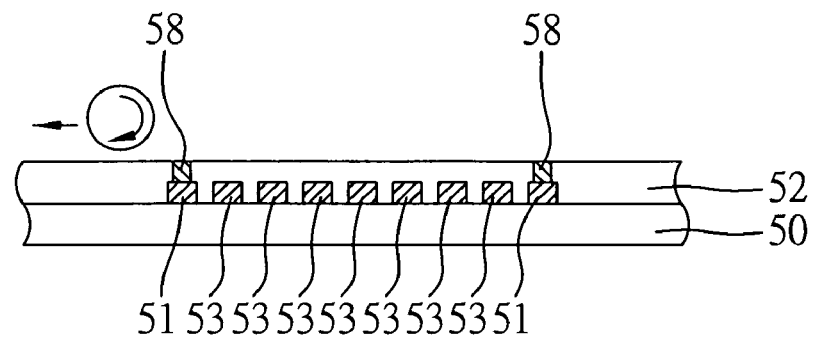

As shown in FIG. 4B, a grinding process is performed such that top edges of the conductive bumps 58 can be flush with surface of the insulating layer 52.

Figure 4C:
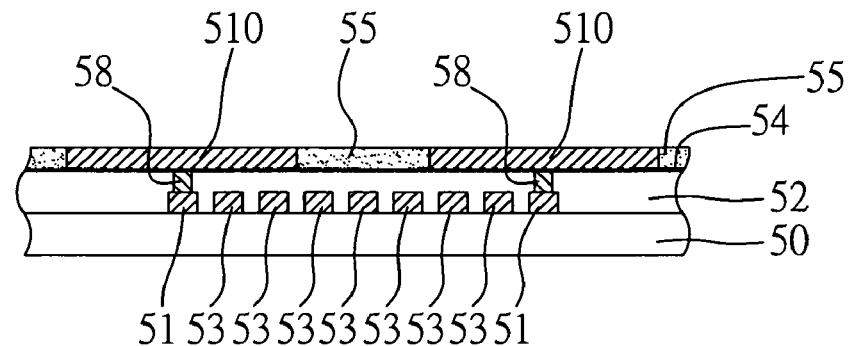

Subsequently, as shown in FIG. 4C, a thin conductive layer 54 made of such as copper is formed on the insulating layer 52 and the conductive bumps 58 by means of sputtering or electroless plating. Further, a resist layer 55 is formed on the conductive layer 54, wherein the resist layer 55 has a plurality of openings formed corresponding in position to the conductive bumps 58. A plurality of extending pads 510 electrically connecting the conductive bumps 58 is formed in the openings of the resist layer 55 by electroplating, wherein the projection area of the extending pads 510 is larger than that of the corresponding solder pads 51 and covers the conductive traces 53 adjacent to the corresponding solder pads 51.

Figure 4D:
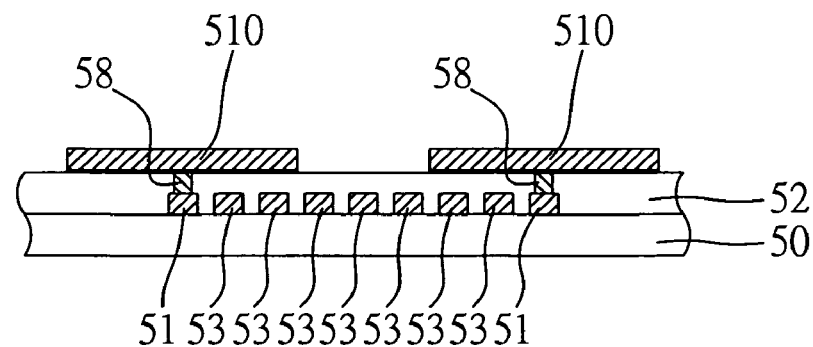

Further as shown in FIG. 4D, the resist layer 55 and the conductive layer 54 covered by the resist layer 55 are removed, thus forming a circuit board structure according to the present invention.

The foregoing descriptions of the detailed embodiments are only illustrated to disclose the features and functions of the present invention and not restrictive of the scope of the present invention. It should be understood by persons skilled in the art that all modifications and variations made according to the spirit and principle in the disclosure of the present invention should fall within the scope of the appended claims.

What is claimed is:

1. A method for fabricating a circuit board structure, comprising the steps of:
    providing a core board having a plurality of solder pads and conductive traces formed thereon, wherein a width of each of the solder pads is smaller than that of each of the conductive corresponds to that of each of the conductive traces, and a pitch between any two adjacent solder pads is made sufficient in width for allowing multiple conductive traces to pass therethrough;
    forming an insulating layer on the core board for covering the conductive traces, the insulating layer being formed with a plurality of openings for exposing the solder pads therefrom; and
    forming on the insulating layer a plurality of extending pads electrically connected to the solder pads respectively, wherein each of the extending pads is larger in area than a corresponding one of the solder pads and overlays a portion of the conductive traces adjacent to the solder pad underneath a corresponding one of the extending pads.

2. The method according to claim 1, further comprising forming solder balls on the extending pads.

3. The method according to claim 1, further comprising the steps of:
forming a solder mask layer on the insulating layer, the solder mask layer having a plurality of openings formed for exposing the extending pads; and
disposing solder balls on the extending pads.

4. The method according to claim 1, wherein a method of manufacturing the extending pads comprises the steps of:
forming a conductive layer on the insulating layer and the solder pads exposed from the insulating layer;
forming on the conductive layer a resist layer with openings formed corresponding in position to the solder pads;
performing an electroplating process to form in the openings of the resist layer a plurality of extending pads electrically connected to the solder pads respectively, wherein each of the extending pads is larger in area than a corresponding one of the solder pads and overlays a portion of the conductive traces adjacent to a corresponding one of the solder pads; and
removing the resist layer and the conductive layer covered by the resist layer.

5. The method according to claim 1, wherein a method of manufacturing the extending pads comprises the steps of:
forming conductive bumps in the openings of the insulating layer, allowing top edges of the conductive bumps to be flush with surface of the insulating layer;
forming a conductive layer on the insulating layer and the conductive bumps;
forming on the conductive layer a resist layer with openings formed corresponding in position to the conductive bumps;
forming in the openings of the resist layer a plurality of extending pads electrically connected to the conductive bumps respectively, wherein the extending pads is larger in area than that of a corresponding one of the solder pads and overlays a portion of the conductive traces adjacent to a corresponding one of the solder pads; and
removing the resist layer and the conductive layer covered by the resist layer.

6. The method according to claim 5, wherein a grinding process is performed so as to make the top edges of the conductive bumps be flush with the surface of the insulating layer.

7. The method according to claim 1, wherein the width of each of the solder pads is between 50 to 100 μm, and a size of each of the openings of the insulating layer is 10 to 20 μm smaller than that of each of the solder pads.

8. The method according to claim 1, wherein the extending pads are made of one of copper and Cu/Ni/Au.

9. A circuit board structure, comprising:
a core board;
a plurality of conductive traces formed on the core board;
a plurality of solder pads formed on the core board, wherein a width of each of the solder pads is smaller than that of each of the conductive traces, and a pitch between any two adjacent ones of the solder pads is made sufficient in width to allow multiple conductive traces to pass therethrough;
an insulating layer formed on the core board for covering the conductive traces, the insulating layer having a plurality of openings formed for exposing the solder pads therefrom; and
a plurality of extending pads formed on the insulating layer and electrically connected to the solder pads respectively, wherein each of the extending pads is larger in area than a corresponding one of the solder pads and overlays a portion of the conductive traces adjacent to a corresponding one of the solder pads.

10. The circuit board structure according to claim 9, further comprising solder balls disposed on the extending pads.

11. The circuit board structure according to claim 9, further comprising:
a solder mask layer formed on the insulating layer and having a plurality of openings for exposing the extending pads; and
solder balls disposed on the extending pads.

12. The circuit board structure according to claim 9, wherein a conductive layer is disposed between the extending pads and the corresponding solder pads.

13. The circuit board structure according to claim 9, wherein conductive bumps are disposed between the extending pads and the corresponding solder pads.

14. The circuit board structure according to claim 13, wherein top edges of the conductive bumps are flush with a surface of the insulating layer.

15. The circuit board structure according to claim 9, wherein the width of each of the solder pads is between 50 to 100 μm, and a size of each of the openings of the insulating layer is 10 to 20 μm smaller than that of each of the solder pads.

16. The circuit board structure according to claim 9, wherein the extending pads are made of one of copper and Cu/Ni/Au.

* * * * *